United States Patent [19]

Kerner et al.

[11] Patent Number: 5,413,166
[45] Date of Patent: May 9, 1995

[54] THERMOELECTRIC POWER MODULE

[76] Inventors: James M. Kerner, 779 Hillgrove Ct., Chico, Calif. 95926; Patrick A. McCauley, 24660 Tehema-Vina Rd. #1, Los Molinos, Calif. 96055; Larry E. McCulloch, 16 Glenshire La., Chico, Calif. 95926; Michael R. Tanner, 2114 Durham-Dayton Hwy., Durham, Calif. 95938

[21] Appl. No.: 60,205

[22] Filed: May 7, 1993

[51] Int. Cl.⁶ ............................................. F25B 29/00
[52] U.S. Cl. ........................................ 165/30; 62/3.4; 165/58; 165/185
[58] Field of Search ............................. 165/30, 58, 185; 62/3.2, 3.3, 3.4, 3.6, 3.62, 457.1

[56] References Cited

U.S. PATENT DOCUMENTS

| | | | |
|---|---|---|---|
| 3,111,166 | 11/1963 | Munz et al. | 165/30 |
| 3,194,023 | 7/1965 | Sudmeier | 62/3 |
| 3,402,561 | 9/1968 | Mahoney | 62/3 |
| 4,089,184 | 5/1978 | Beitner | 62/3 |
| 4,107,934 | 8/1978 | Beitner | 62/3 |
| 4,274,262 | 6/1981 | Reed et al. | 62/3 |
| 4,297,850 | 11/1981 | Reed | 62/3 |
| 4,311,017 | 1/1982 | Reed et al. | 62/3 |
| 4,326,383 | 4/1982 | Reed et al. | 62/3 |
| 4,328,676 | 5/1982 | Reed | 62/3 |
| 4,346,562 | 8/1982 | Beitner | 62/3 |
| 4,407,133 | 10/1983 | Edmonson | 62/3 |
| 4,453,385 | 6/1984 | May | 62/3 |
| 4,581,898 | 4/1986 | Preis | 62/3 |
| 4,759,190 | 7/1988 | Trachtenberg et al. | 62/3 |
| 4,789,025 | 12/1988 | Brandemuehl | 165/30 |
| 4,823,554 | 4/1989 | Trichenberg et al. | 62/3 |
| 4,834,169 | 5/1989 | Tershak | 165/30 |
| 4,981,019 | 1/1991 | Hicks et al. | 62/3.62 |
| 4,984,628 | 1/1991 | Uchida | 165/30 |
| 5,029,446 | 7/1991 | Suzuki | 62/3.6 |
| 5,042,258 | 8/1991 | Sundhar | 62/3.2 |
| 5,052,472 | 10/1991 | Takahashi | 165/30 |
| 5,060,479 | 10/1991 | Carmi et al. | 62/362 |
| 5,069,273 | 12/1991 | O'Hearne | 165/30 |
| 5,123,477 | 6/1992 | Tyler | 165/30 |

OTHER PUBLICATIONS

"1991 Coleman Outdoor Products, Inc." catalog pp. 38 & 39, The Coleman Company, Inc., 250 North St. Francis, Wichita, Kan. 67202; 1990.

"Igloo 1992 Product Catalog and Price List" catalog pp. 2 & 3, Igloo Products Corp., P.O. Box 19322, Houston, Tex. 77224-9322; 1991.

Primary Examiner—Ira S. Lazarus
Assistant Examiner—Daniel J. O'Connor
Attorney, Agent, or Firm—Ron Fish; Falk, Vestal & Fish

[57] ABSTRACT

A thermoelectric module (10) which is adapted to selectively heat or cool the inside of a container includes an exterior heat exchanger (51) having a plurality of spaced and generally parallel undulating fins (52). An exterior fan (31) is positioned adjacent to the exterior heat exchanger (51) and is adapted to move air from the outside of the container through the spaces between the fins (52) of the exterior heat exchanger (51). An interior heat exchanger (54) has a plurality of spaced and generally parallel undulating fins (55). An interior fan (42) is positioned adjacent to the interior heat exchanger (54) and is adapted to move air from the inside of the container through the spaces between the fins (55) of the interior heat exchanger (54). A motor (28) drives the fans (31, 42) and is cooled by air drawn in through apertures (34) in the hub (32) of the exterior fan (31). A suitable wick-like moisture absorbing material (73), which may be a cellulose material, is positioned generally around and below the interior heat exchanger (54) to receive moisture which might accumulate on the fins (55) thereof.

43 Claims, 3 Drawing Sheets

THERMOELECTRIC POWER MODULE

TECHNICAL FIELD

This invention relates to a modular thermoelectric power package which is positionable in a wall of a container, or the like, to selectively maintain the contents thereof cool or warm, as desired. More specifically, this invention relates to a thermoelectric power module which is more efficient and more maintenance-free than known thermoelectric power units.

BACKGROUND ART

Containers, such as small refrigerators, coolers or chests for maintaining food items cool or warm, which obtain their cooling or heating capabilities through a thermoelectric device, are known in the art. Most prior art thermoelectrically powered containers are provided with a power unit permanently positioned in one of the walls thereof. The unit often includes two sets of extruded, planar, heat exchanging fins, one set of fins being exposed to and often extending into the container and the other set of fins being exposed to ambient conditions.

A conventional thermoelectric semiconductor device is positioned between the heat exchanging fins. As is known in the art, when direct current is passed in one direction through the device, one of the sets of fins is caused to be heated while the other set of fins is cooled. When the current is reversed, the other set of fins is heated and the first set of fins is cooled. In the container cooling mode, fans positioned adjacent to the fins transmit cool air from the internal cool fins to the inside of the container and at the same time transfer warm air away from the outside fins. In the warming mode, the fans transmit the warm air from the internal fins to the inside of the container and at the same time transfer cool air away from the outside fins.

While such units satisfactorily selectively cool or heat the contents of a container, as desired, they are not without their problems. For example, in some units the internal fins extend far into the container, which fins take up valuable storage space, are subject to being damaged or contaminated by liquid spillage, and can cause a safety hazard to the user whose hands could be scratched by the fins. Moreover, when the power unit is in need of maintenance, it must be disassembled from the container which is not only a time-consuming task requiring technical skill but also such activity renders the container useless for its intended purpose until the power unit can be replaced.

In addition to contaminated or damaged fins, one of the problems potentially causing dissatisfaction with the operation of such devices is the accumulation of condensed moisture in the unit. Presently known forms of moisture removal only permit a dripping into the container itself, which is not conducive to the storage of items therein.

Other maintenance problems can arise by virtue of an overheating of the motor which drives the fans. Presently known thermoelectric units are not provided with any convenient means to maintain the motor cool to avoid the potential need to replace the same.

Finally, the cooling or heating efficiency relative to the size of known thermoelectric power units is lacking. By providing parallel, planar, adjacent fins, the ability of air being moved by the fans to find facile access to the space therebetween across the width of the fins is limited, and once the air is positioned and moved between the fins, the unobstructed path facilitates the disadvantageous quick movement therethrough which diminishes the heat exchange efficiency.

Thus, the need exists for a modular, more efficient, and more maintenance-free thermoelectric power unit, a need which is provided by the thermoelectric power module made in accordance with the concepts of the present invention.

DISCLOSURE OF THE INVENTION

It is thus an object of the present invention to provide a thermoelectric power unit which is self-contained in modular form and which can be readily positioned in or removed from a container which it is servicing without technical skill.

It is another object of the present invention to provide a thermoelectric power unit which is not only more maintenance-free, but also easier to maintain when such is required.

It is a further object of the present invention to provide a thermoelectric power unit, as above, which efficiently transfers its heating or cooling energy to the inside of the container.

It is an additional object of the present invention to provide a thermoelectric power unit, as above, which has uniquely configured heat exchanging fins thereby enhancing the thermal transfer efficiency thereof and reducing the overall size requirements of the module.

It is another object of the present invention to provide a thermoelectric power unit, as above, in which the heat exchanging fins more readily receive air between them and cause turbulence of the air flowing therebetween to enhance the thermal transfer efficiency thereof.

It is yet another object of the present invention to provide a thermoelectric power unit, as above, which has enhanced motor cooling characteristics.

It is a still further object of the present invention to provide a thermoelectric power unit, as above, which removes condensed moisture internally without the undesirable deposit into the container.

These and other objects of the present invention, as well as the advantages thereof over existing prior art forms, which will become apparent from the description to follow, are accomplished by the improvements hereinafter described and claimed.

In general, a thermoelectric power module which is capable of selectively heating or cooling the inside of a container, and made in accordance with a concept of the present invention, includes a first heat exchanger having spaced and generally parallel undulating fins. A first fan is positioned adjacent to the first heat exchanger to move air from the outside of the container through the spaces between the fins of the first heat exchanger. A second heat exchanger, having spaced and generally parallel undulating fins, is positioned adjacent to a second fan which moves air from inside of the container through the spaces between the fins of the second heat exchanger. A thermoelectric semiconductor power device is positioned between the heat exchangers to selectively heat one of the heat exchangers while cooling the other heat exchanger.

In accordance with other of the concepts of the present invention, the first and second fans are driven by a motor which is cooled by air being drawn in through apertures provided in the hub of the first fan. In addition, moisture which may accumulate on the fins of the second heat exchanger is collected by a suitable liquid absorbing material which removes the moisture to the atmosphere outside of the container.

A preferred exemplary thermoelectric power module incorporating the concepts of the present invention is shown by way of example in the accompanying drawings without attempting to show all the various forms and modifications in which the invention might be embodied, the invention being measured by the appended claims and not by the details of the specification.

PREFERRED EMBODIMENT FOR CARRYING OUT THE INVENTION

Figure 1:
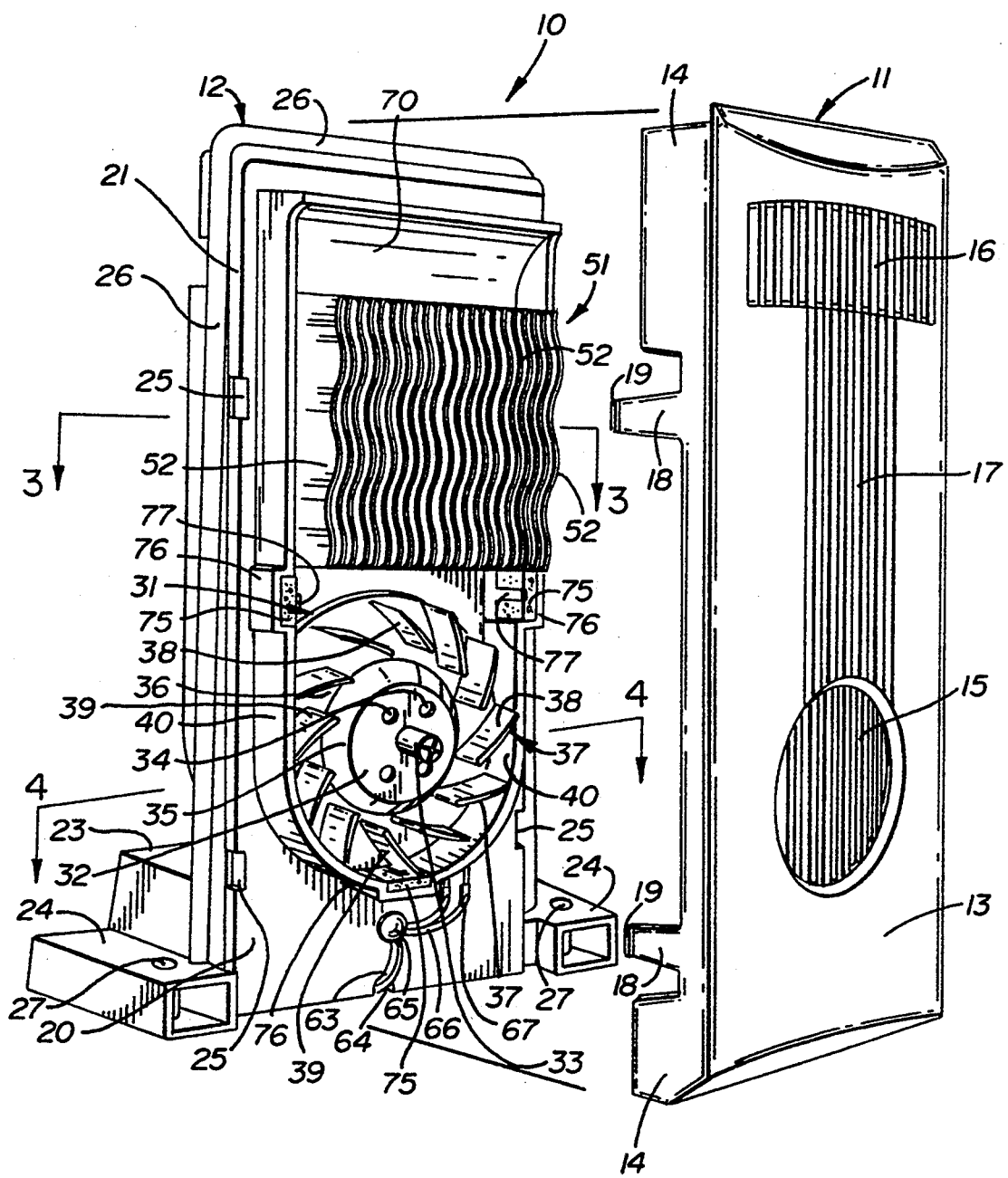
FIG. 1 is a front perspective view of a thermoelectric power module made in accordance with the concepts of the present invention having the front cover thereof exploded away.

A thermoelectric power module made in accordance with the concepts of the present invention is indicated generally by the numeral 10 and includes a removable front cover, indicated generally by the numeral 11, and a main housing indicated generally by the numeral 12.

Cover 11 is preferably made of any suitable plastic material and includes a front face 13 having side walls 14 extending rearwardly therefrom. Front face 13 is provided with a lower air intake grillework 15 through which air may pass toward main housing 12 and an upper air exit grillework 16 though which air may pass away from main housing 12. Complementary ribbing 17 may also be provided on front face 13 between grillework 15 and grillework 16 merely to adorn front face 13 and to accentuate the presence of grilleworks 15 and 16. Upper and lower resilient tabs 18 having lock barbs 19 at the outer or rear ends thereof are formed in side walls 14 and, as will hereinafter be described, serve to engage main housing 12.

Main housing 12 is also preferably constructed of a plastic material and includes a front face 20 and side walls 21 extending rearwardly therefrom to a rear face 22 spaced from and generally parallel to front face 20. A pedestal base 23 having side wings 24 extends rearwardly from rear face 22, at the bottom thereof, to provide module 10 with a fastening interface to the container it is servicing. Front face 20 is provided with upper and lower slots 25 which receive tabs 18 therethrough in such a manner that barbs 19 engage the rear of front face 20 (FIGS. 3 and 4) to hold cover 11 in place. Of course, cover 11 may be removed by merely flexing tabs 18 inwardly toward each other to release barbs 19 and thereafter sliding cover 11 away from housing 12.

Module 10 is designed to be slid into a thermally insulated container having a recess, shaped complementarily to module 10, preferably located at the bottom of one of the walls thereof. To that end, a keyway tongue 26 is formed in each side wall 21 and extends upwardly around the top of housing 12 as well. Tongue 26 is adapted to be received in a track formed in the recess of the container such that when module 10 is inserted therein, the bottom of pedestal base 23 and side wings 24 will be flush with the bottom of the container. Apertures 27, which are provided through side wings 24, enable module 10 to be fastened to the container, as by extending screws upwardly therethrough and into the container. Of course, removal of the screws allows module 10 to be slid out of the container for maintenance or replacement purposes.

Figure 4:
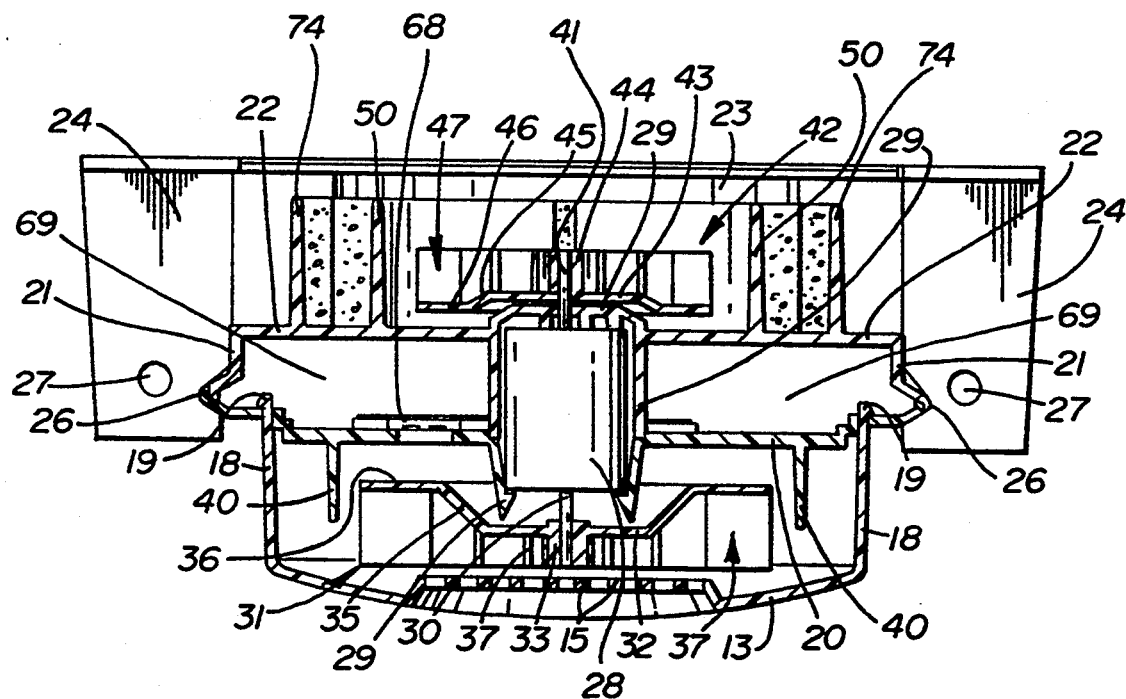
FIG. 4 is a sectional view taken substantially along line 4—4 of FIG. 1, but having the front cover in place.

As shown in FIG. 4, a DC motor 28 is positioned in a bracket 29 that extends between front face 20 and rear face 22 of housing 12. A forwardly extending shaft 30, reversibly driven by motor 28, carries a front or exterior fan generally indicated by the numeral 31. As shown in FIGS. 1 and 4, fan 31 includes a hub portion 32 positioned generally adjacent to air intake grillework 15. A retaining socket 33 extends axially away from hub portion 32 and frictionally engages motor shaft 30 so that fan 31 rotates with shaft 30. Hub portion 32 is also provided with a plurality of apertures 34 therein such that as hub portion 32 rotates, warm air which may surround motor 28 is drawn out through apertures 34 to maintain motor 28 cool.

Fan hub portion 32 extends angularly rearwardly, as at 35, to the face plate 36 of fan 31 which is thereby positioned in a plane generally parallel to hub portion 32. Face plate 36 carries a plurality of fan blades, generally indicated by the numeral 37, which extend generally radially away from hub portion 32 and axially away from plate 36. Blades 37 are preferably arcuate, as opposed to pure radial, in configuration, having a concave side 38 and a convex side 39. A U-shaped peripheral shroud 40 extends outwardly from front face 20 and generally surrounds the sides and lower portion of fan 31.

Figure 2:
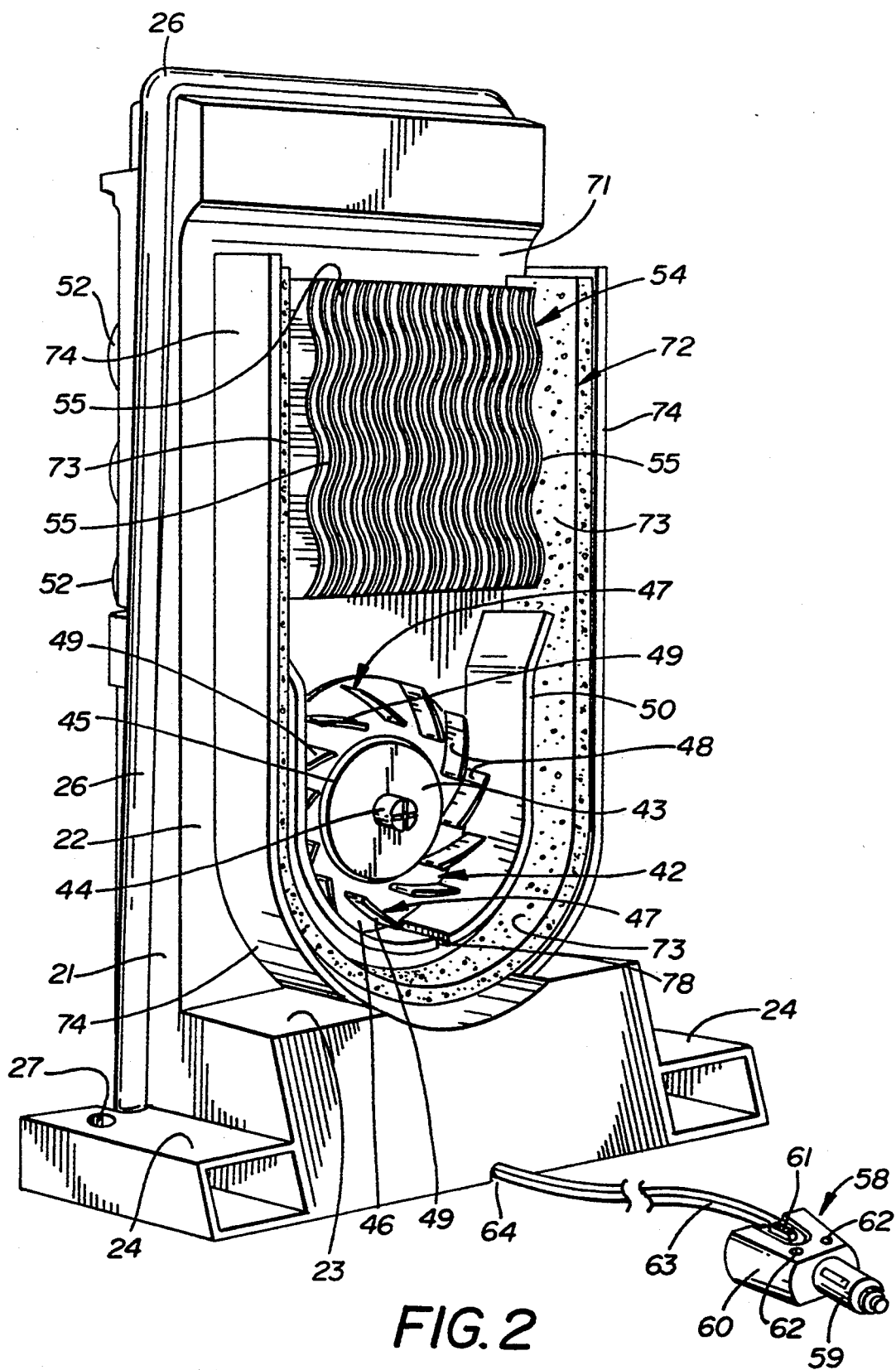
FIG. 2 is a rear perspective view of the thermoelectric power module of FIG. 1.

Motor 28 also has a reversibly driven shaft 41, which is actually an extension of shaft 30, extending rearwardly therefrom to carry a rear or interior fan generally indicated by the numeral 42. Of course, as would be evident to one skilled in the art, a second motor with a separate shaft could be provided for fan 42 without departing from the concepts of the present invention. As shown in FIGS. 2 and 4, fan 42 includes a hub portion 43 having a retaining socket 44 extending axially away therefrom to frictionally engage motor shaft 41 so that fan 42 rotates with shaft 41. Hub portion 43 extends toward motor 32, as at 45, to the face plate 46 of fan 42 which is thereby positioned in a plane parallel to hub portion 43. Face plate 46 carries a plurality of fan blades, generally indicated by the numeral 47, which extend generally radially away from hub portion 43 and axially away from plate 46. Like blades 37, blades 47 are preferably arcuate, as opposed to pure radial, in configuration, having a concave side 48 and a convex side 49. A generally U-shaped peripheral shroud 50 extends outwardly from rear face 22 and generally surrounds the sides and lower portion of fan 42.

Figure 3:
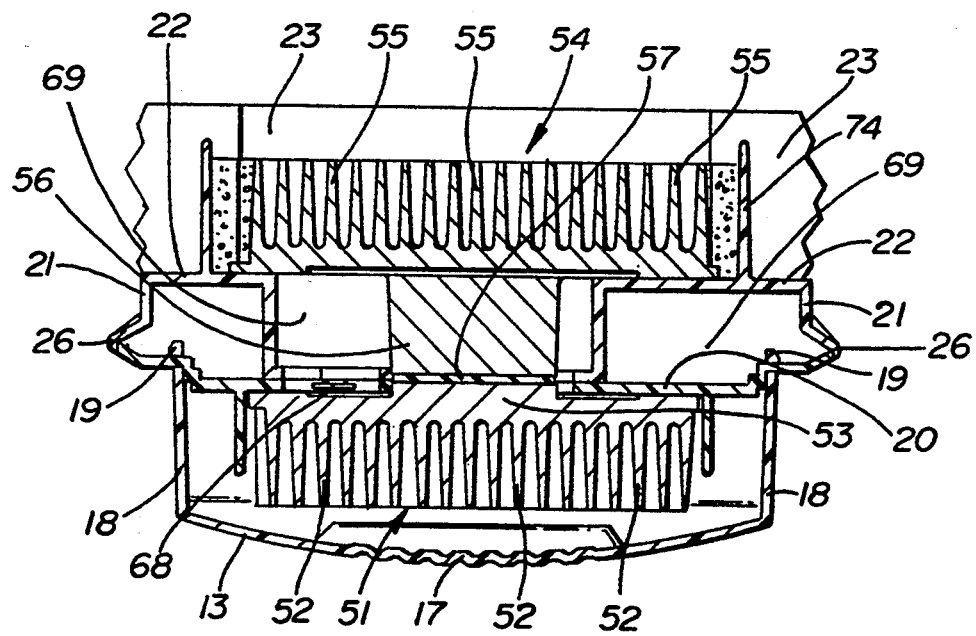
FIG. 3 is a fragmented sectional view taken substantially along line 3—3 of FIG. 1, but having the front cover in place.

As shown in FIGS. 1 and 3, an outer heat exchanger, generally indicated by the numeral 51, is positioned above fan 31 and includes a plurality of spaced, undulating, parallel fins 52. Heat exchanger 51 is preferably and economically made of a cast aluminum alloy or other suitable castable alloy having high heat conductivity properties. Heat exchanger 51 includes a base plate or hub 53 which carries fins 52 and a portion of which extends through an aperture in front face 20. Base plate 53 may be attached to front face 20 by any suitable adhesive.

As shown in FIGS. 2 and 3, an interior heat exchanger, generally indicated by the numeral 54, is positioned above fan 42 and includes a plurality of spaced, undulating, parallel fins 55. Like heat exchanger 51, heat exchanger 54 is preferably made of a cast aluminum alloy and includes a base plate and integral extender hub block 56 which is positioned through an opening in rear face 22 and attached thereto so as to be adjacent to hub 53 of heat exchanger 51. Heat exchanger 54 may be attached to rear face 22 by any suitable adhesive.

As will hereinafter be discussed in more detail, the undulating configuration of fins 52 and 55 causes air passing therethrough to take a tortuous path which extends the retention time and increases turbulence of the air between the fins thereby enhancing the efficiency thereof. Moreover, by terminating the bottom of fins 52 and 55 at an undulation whereby the space between the fins is aligned with the flow of air created by fans 31 and 42 when rotating clockwise, as seen in FIGS. 1 and 2, air will more evenly and efficiently enter between adjacent fins 52 and 55 as will be hereinafter described in greater detail. Such configuration allows heat exchangers 51 and 54 to be constructed of the cast aluminum or other alloy, as previously described, which is lighter in weight and of a smaller footprint than the traditional extruded heat exchangers and yet heat exchangers 51 and 54 have a thermal performance equal to or greater than the extruded heat exchangers.

A conventional thermoelectric semiconductor power device 57, which can be encapsulated in a plastic housing, is sandwiched between and otherwise attached, as by a suitable adhesive, between the opposed faces of hub 53 of heat exchanger 51 and extender block 56 of heat exchanger 54. As is known in the art, when current is applied to device 57 in one direction, it will cause one of the heat exchangers to be cooled and the other to be heated. When the current is reversed, the previously cooled heat exchanger will be heated and the previously heated heat exchanger will be cooled.

The power to module 10 can be provided by any DC source, such as the twelve volts of a car battery should the container having the module be used in a vehicle, or household current converted to DC by a conventional AC to DC converter. To that end, module 10 is provided with a power plug generally indicated by the numeral 58 having a tip 59 adapted to be received by the cigarette lighter of a vehicle, or by the AC to DC converter. The body portion 60 of plug 58 is provided with a switch 61 to change the direction of the current, that is, to direct module 10 to be in a cooling or heating mode. Light emitting diodes 62 may be provided to provide the user with a visual indication as to which mode is currently in use. For example, one diode 62 can emit a red light indicating that the container currently being serviced by module 10 is being internally heated, and the other diode 62 can emit a green light indicative that module 10 is in the cooling mode.

A power cord 63 extends from plug 58 and can be routed under the container being serviced by module 10 and through a slot 64 formed under pedestal base 23 to front face 20. A stress relief feature 65 may be positioned on front face 20 and lead wires 66, extending from cord 63, may be directed to spade/lug disconnects 67 and then directed internally of module 10 to a bus bar 68 (FIGS. 3 and 4). From bus bar 68, power is then directed to reversible motor 28 and to the thermoelectric semiconductor device 57.

In operation, if for example cooling of the container is desired, switch 61 is turned to the cooling mode and semiconductor device 57 will cool internal heat exchanger 54 and heat external heat exchanger 51. The space 69 between front face 20 and rear face 22 may be filled with an insulation material so that the front and rear of module 10 are thermally isolated from each other as much as possible. At the same time, motor 28 will drive the external fan 31 in a clockwise direction as viewed in FIG. 1 and, of course, internal fan 42 will rotate in a counterclockwise direction, as viewed in FIG. 2. Since it is desirable to have the maximum air flow acting in conjunction with the hot heat exchanger, it will be observed that in the instance just described, fan 31 is operating to create the most flow in that air is being drawn in through grillework 15, and the convex sides 39 of blades 37 are moving the air toward heat exchanger 51. Because, as previously described, the openings being the bottom of fins 52 are turned to the left, as viewed in FIG. 1, that is, toward the airflow, there will be a more direct-line flow of air from the clockwise rotating fan 31 into the spaces between fins 52. The air from fan 31 is further guided toward fins 52 due to the presence of shroud 40. That air then follows its tortuous path through exchanger 51, removing heat therefrom, and exits at the top of exchanger 51. The exiting warm air then contacts a turning vane 70 formed at the top of front face 20 which directs the warm air out through grillework 16 to the outside of module 10.

Inasmuch as the heating/cooling characteristics of thermoelectric power are such that more heating energy is developed on the hot fins than cooling energy on the cool fins, the air flow developed by fan 42 need not be as great as that developed by fan 31 during the cooling mode. Thus, in the cooling mode, with fan 42 rotating in the counterclockwise direction, as viewed in FIG. 2, the concave side 48 of blades 47 is directing air from the inside of the container toward fins 55 of heat exchanger 54. Because the bottom of fins 55 are turned away from the air flow, that is, to the left as seen in FIG. 2, the air does not have the totally direct-line flow as is the case with the external heat exchanger 51, as just described. But, as previously described, since fins 55 are, in this instance, the cool fins, maximum air flow is not required. Thus, even though the purely direct-line flow of air to the spaces between fins 55 does not exist, nevertheless, air does enter these spaces, travel its tortuous path and exit at the top of exchanger 54. The top of rear face 22 is provided with an arcuate surface 71 which directs the cool air into the container.

However, as now will be described, when in the heating mode, the relationship of fan 42 and fins 55 is such so as to maximize the removal of heat from fins 55 to the inside of the container. Thus, if warming the contents of the container being serviced by module 10 is desired, switch 61 is turned to the warming mode and semiconductor device 57 will warm internal heat exchanger 54 and cool external heat exchanger 51. At the same time, motor 28 will drive internal fan 42 in a clockwise direction, as viewed in FIG. 2, with external fan 31 thereby rotating in a counterclockwise direction, as viewed in FIG. 1. Thus, again the maximum air flow will act in conjunction with the warm heat exchanger because the convex sides 49 of blades 47 are moving toward heat exchanger 54 and because the bottom of fins 55 thereof are turned toward the airflow, that is, to the left, as viewed in FIG. 2, thereby creating the direct line flow of air previously described. Shroud 50 also assists to direct the air to fins 55. Thus, warm air is discharged to the container from heat exchanger 54 and cool air is discharged to the atmosphere from heat exchanger 51.

Because internal heat exchanger 54 is constantly exposed only to the confined atmosphere inside of the container being serviced by module 10, it is likely that moisture may accumulate on fins 55 thereof, particularly after periods of cooling. The dripping of water from the fins can be deleterious to module 10 or the contents of the container being serviced and thus a moisture removal assembly, generally indicated by the numeral 72, is preferably incorporated in module 10. Moisture removal assembly 72 includes an absorbing material 73 which, as viewed in FIG. 2, is U-shaped in nature and which can be of a cellulose fiber or like material. The absorbing material 73 is confined on the outside by a U-shaped member 74 extending rearwardly from rear face 22, with the lower portion of material 73 being positioned between member 74 and fan shroud 50 and the upper branch portions thereof being positioned adjacent to the edges of heat exchanger 55. The edge of material 73 which is positioned adjacent to rear face 22 is provided with three wick-like tabs 75 (FIG. 1) which extend forwardly through rear face 22 and through front face 20. For this purpose, fan shroud 40 is provided with notches 76, and tabs 77 extend outwardly from face 20 and are opposed to notches 76 so that the wick-like tabs 75 of material 73 can be confined between notches 76 and tabs 77 thereby holding material 73 in place. When material 73 absorbs the moisture from fins 55, as will hereinafter be described, it will swell such that wick-like tabs 75 are even more securely held between notches 76 and tabs 77. The expansion of the material 73 also enhances the airtight seal between the internal air and the ambient air to eliminate any leakage of air which would detract from the efficiency of the unit. In fact, tabs 75 may be pre-wetted during the manufacture of module 10 to create the seal immediately, which seal remains even after the material 73 may dry because it remains in its expanded condition.

Assuming that module 10 is positioned in the container in its upright position shown in FIG. 2, moisture which may form on fins 55 is allowed to drip therefrom onto the inside of shroud 50. The bottom of shroud 50 is provided with an open slot 78 and thus, moisture received by shroud 50 may pass through slot 78 and onto the material 73. As moisture accumulates in material 73, through capillary action it, including wick-like tabs 75, becomes fully saturated, but moisture will evaporate from tabs 75 to the atmosphere through front cover 11. Since it is possible to orient module 10 on its side in a container without deleteriously affecting the operation thereof, material 73 may be extended upwardly higher than the top of fins 55 as depicted in FIG. 2. In this instance, accumulated moisture will drop from the top and bottom of fins 55 directly to the material 73.

In view of the foregoing, it should be evident that a thermoelectric power module constructed in accordance with the concepts of the present invention, as described herein, accomplishes the objects of the invention and otherwise substantially improves the art.

We claim:

1. Apparatus for selectively heating or cooling the inside of a container comprising a first heat exchanger having spaced and generally parallel undulating fins, a first fan adjacent to said first heat exchanger and adapted to move air from the outside of the container through the spaces between said fins of said first heat exchanger, a second heat exchanger having spaced and generally parallel undulating fins, a second fan adjacent to said second heat exchanger and adapted to move air from the inside of the container through the spaces between said fins of said second heat exchanger, and power means between said first and second heat exchangers to selectively heat one of said first and second heat exchangers while cooling the other of said first and second heat exchangers.

2. Apparatus according to claim 1 wherein said first and second fans include arcuate fan blades having a convex side and a concave side, said convex side of said fan blades of said first fan moving the air in a direction toward said first heat exchanger when said first heat exchanger is being heated, and said convex side of said fan blades of said second fan moving the air in a direction toward said second heat exchanger when said second heat exchanger is being heated.

3. Apparatus according to claim 2 wherein the space between said fins of each said heat exchanger adjacent to each said fan is generally aligned with said air direction.

4. Apparatus according to claim 1 further comprising shroud means around said first fan to direct the air toward said first heat exchanger.

5. Apparatus according to claim 1 further comprising shroud means around said second fan to direct the air toward said second heat exchanger.

6. Apparatus according to claim 1 further comprising a motor positioned between said first and second fans to rotate said first and second fans, a first motor shaft carrying said first fan, and a second motor shaft carrying said second fan, such that when said first fan is rotating in a clockwise direction said second fan is rotating in a counterclockwise direction.

7. Apparatus according to claim 1 further comprising a housing having a first face and a second face spaced from said first face, said first fan and said first heat exchanger being positioned adjacent to said first face and said second fan and said second heat exchanger being positioned adjacent to said second face.

8. Apparatus according to claim 7 further comprising a motor to drive each said fan and positioned in the space between said first and second face.

9. Apparatus according to claim 7 wherein said first heat exchanger includes a hub member carrying said fins of said first heat exchanger and said second heat exchanger includes a hub member carrying said fins of said second heat exchanger, said hub member of said first heat exchanger extending through said first face and said hub member of said second heat exchanger extending through said second face, said power means being attached between said hub members.

10. Apparatus according to claim 7, said second face having means to direct the air from said second heat exchanger toward the inside of the container.

11. Apparatus according to claim 7, said housing having side walls between said first and second face, said side walls having means thereon adapted to be received by the container.

12. Apparatus according to claim 7 further comprising a cover, and means to attach said cover to said front face.

13. Apparatus according to claim 12 wherein said means to attach includes tabs extending from said cover toward said front face, lock barbs at the end of said tabs, and recesses in said front face to receive said lock barbs.

14. Apparatus according to claim 12 further comprising air intake grillework in said cover adjacent to said first fan and air exit grillework in said cover adjacent to said first heat exchanger.

15. Apparatus according to claim 14, said first face having means to direct the air from said first heat exchanger toward said air exit grillework.

16. Apparatus according to claim 1 further comprising a motor to drive said fans, plug means adapted to receive direct current electric power, and electrical wires connecting said plug means to said motor and to said power means.

17. Apparatus according to claim 16 wherein said plug means includes a switch to change the direction of said direct current power thereby operating said motor to turn said first and second fans selectively in a first and second direction and operating said power means to selectively heat one of said first and second heat exchangers while cooling the other of said first and second heat exchangers.

18. Apparatus according to claim 17 wherein said plug means includes means to indicate which of said heat exchangers is being heated and which is being cooled.

19. Apparatus according to claim 1 further comprising a motor to rotate said fans, said first fan including means to cool said motor.

20. Apparatus according to claim 19 wherein said first fan includes a hub member, said means to cool including apertures in said hub member to draw air away from said motor.

21. Apparatus according to claim 1 further comprising means to remove moisture which may form on said fins of said second heat exchanger.

22. Apparatus according to claim 21 further comprising a motor to rotate said fans, said first fan including means to cool said motor.

23. Apparatus according to claim 21 wherein said means to remove moisture includes a liquid absorbing material positioned adjacent to said second fan and said second heat exchanger.

24. Apparatus according to claim 23 further comprising a housing having a first face and a second face spaced from said first face, said first fan and said first heat exchanger being positioned adjacent to said first face and said second fan and said second heat exchanger being positioned adjacent to said second face.

25. Apparatus according to claim 24 further comprising shroud means around said second fan to direct the air toward said second heat exchanger, and means extending from said second face and spaced from said shroud means, said liquid absorbing material being confined between said shroud means and said means.

26. Apparatus according to claim 25 wherein said shroud means has a slot therein, moisture from said fins of said second heat exchanger passing through said slot to be received by said liquid absorbing material.

27. Apparatus according to claim 25 further comprising shroud means around said first fan to direct air toward said first heat exchanger, and a plurality of notches in said shroud means, said liquid absorbing material having tabs passing through said second and first faces and received by said notches.

28. Apparatus for selectively heating or cooling the inside of a container comprising a first heat exchanger, a first fan adjacent to said first heat exchanger and adapted to move air from the outside of the container toward said first heat exchanger, a second heat exchanger, a second fan adjacent to said second heat exchanger and adapted to move air from the inside of the container toward said second heat exchanger, power means between said first and second heat exchangers to selectively heat one of said first and second heat exchangers while cooling the other of said first and second heat exchangers, and a motor for rotating said fans, said first fan being provided with means to cool said motor.

29. Apparatus according to claim 28 wherein said first fan includes a hub portion, said means to cool said motor including apertures in said hub portion such that upon rotation of said first fan, air is drawn away from the said motor and through said apertures to cool said motor.

30. Apparatus according to claim 28 wherein said first and second fans include arcuate fan blades having a convex side and a concave side, said convex side of said fan blades of said first fan moving the air in a direction toward said first heat exchanger when said first heat exchanger is being heated, and said convex side of said fan blades of said second fan moving the air in a direction toward said second heat exchanger when said second heat exchanger is being heated.

31. Apparatus according to claim 30 wherein each said heat exchanger includes a plurality of spaced undulating fins, the space between said fins of each said heat exchanger adjacent to each said fan being generally aligned with said air direction.

32. Apparatus according to claim 31 further comprising means to remove moisture which may form on said fins of said second heat exchanger.

33. Apparatus according to claim 32 wherein said means to remove moisture includes a liquid absorbing material positioned adjacent to said second fan and said second heat exchanger.

34. Apparatus according to claim 28 wherein each said heat exchanger includes a plurality of spaced generally parallel fins whereby moisture may form on said fins of said second heat exchanger, and further comprising means to remove any moisture formed on said fins of said second heat exchanger.

35. Apparatus for selectively heating or cooling the inside of a container comprising a first heat exchanger having spaced fins, a first fan adjacent to said first heat exchanger and adapted to move air from the outside of the container through the spaces between said fins of said first heat exchanger, a second heat exchanger having spaced fins, a second fan adjacent to said second heat exchanger and adapted to move air from the inside of the container through the spaces between said fins of said second heat exchanger, power means between said first and second heat exchangers to selectively heat one of said first and second heat exchangers while cooling the other of said first and second heat exchangers whereby moisture may form on at least said fins of said second heat exchanger, and means positioned to receive the moisture from said fins of said second heat exchanger to remove the moisture to the atmosphere outside the container.

36. Apparatus according to claim 35 wherein said means to remove moisture includes a liquid absorbing material positioned adjacent to said second fan and said second heat exchanger.

37. Apparatus according to claim 36 further comprising a housing having a first face and a second face spaced from said first face, said first fan and said first heat exchanger being positioned adjacent to said first face and said second fan and said second heat exchanger being positioned adjacent to said second face.

38. Apparatus according to claim 37 further comprising a motor to drive each said fan and positioned in the space between said first and second face, said first fan being provided with means to cool said motor.

39. Apparatus according to claim 37 wherein said fins of each said heat exchanger undulate so as to provide a tortuous path for the air passing therethrough.

40. Apparatus according to claim 37 further comprising shroud means around said second fan to direct the air toward said second heat exchanger, and means extending from said second face and spaced from said shroud means, said liquid absorbing material being confined between said shroud means and said means.

41. Apparatus according to claim 40 wherein said shroud means has a slot therein, moisture from said fins of said second heat exchanger passing through said slot to be received by said liquid absorbing material.

42. Apparatus according to claim 40 further comprising shroud means around said first fan to direct air toward said first heat exchanger, and a plurality of notches in said shroud means, said liquid absorbing material having tabs passing through said second and first faces and received by said notches.

43. Apparatus for selectively heating or cooling the inside of a container comprising a first heat exchanger, a first fan adjacent to said first heat exchanger and adapted to move air from the outside of the container toward said first heat exchanger, a second heat exchanger, a second fan adjacent to said second heat exchanger and adapted to move air from the inside of the container toward said second heat exchanger, a motor for rotating said fans, said first fan being provided with means to cool said motor, power means between said first and second heat exchangers to selectively heat one of said first and second heat exchangers while cooling the other of said first and second heat exchangers whereby moisture may form on at least said second heat exchanger, and means positioned to receive the moisture from said second heat exchanger to remove the moisture to the atmosphere outside the container.

* * * * *